United States Patent
Piorkowski

(10) Patent No.: US 7,379,356 B2
(45) Date of Patent: May 27, 2008

(54) MEMORY, INTEGRATED CIRCUIT AND METHODS FOR ADJUSTING A SENSE AMP ENABLE SIGNAL USED THEREWITH

(75) Inventor: Martin P Piorkowski, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 32 days.

(21) Appl. No.: 11/542,410

(22) Filed: Oct. 3, 2006

(65) Prior Publication Data
US 2008/0084781 A1    Apr. 10, 2008

(51) Int. Cl.
*G11C 7/00* (2006.01)
*G11C 7/02* (2006.01)

(52) U.S. Cl. .................... 365/196; 365/194; 365/195; 365/207

(58) Field of Classification Search ................ 365/194, 365/195, 196, 207
See application file for complete search history.

(56) References Cited

U.S. PATENT DOCUMENTS

| | | | | |
|---|---|---|---|---|
| 4,092,736 A | * | 5/1978 | Baker ........................ | 365/184 |
| 4,928,048 A | * | 5/1990 | Doyle ........................ | 318/644 |
| 5,481,500 A | * | 1/1996 | Reohr et al. ................ | 365/203 |
| 6,094,379 A | * | 7/2000 | Sago .......................... | 365/190 |
| 6,504,778 B1 | * | 1/2003 | Uekubo ...................... | 365/207 |
| 6,507,222 B1 | * | 1/2003 | Jensen et al. ................ | 327/51 |
| 6,577,548 B1 | * | 6/2003 | Barth et al. ................. | 365/210 |
| 2005/0276127 A1 | * | 12/2005 | Takeuchi .............. | 365/189.09 |

FOREIGN PATENT DOCUMENTS

| | | | | |
|---|---|---|---|---|
| JP | 2001155490 A | * | 6/2001 | |
| KR | 2001044892 A | * | 6/2001 | |

* cited by examiner

*Primary Examiner*—Ly D Pham
(74) *Attorney, Agent, or Firm*—Garlick, Harrison & Markison; Bruce E. Stuckman

(57) ABSTRACT

A memory includes at least one memory segment that includes an array of memory cells arranged in a plurality of columns, each of the plurality of columns having a corresponding bitline pair. An address decoder includes a row decoder and a column decoder that addresses a selected one of the array of memory cells in a selected one of the plurality of columns in response to a memory address. A sense amplifier generates a data output by sensing a differential voltage from the corresponding bitline pair of the selected one of the plurality of columns in response to a sense amp enable signal. A sense amp enable signal generator generates the sense amp enable signal with adjustable timing, based on sense amp feedback signals.

25 Claims, 15 Drawing Sheets

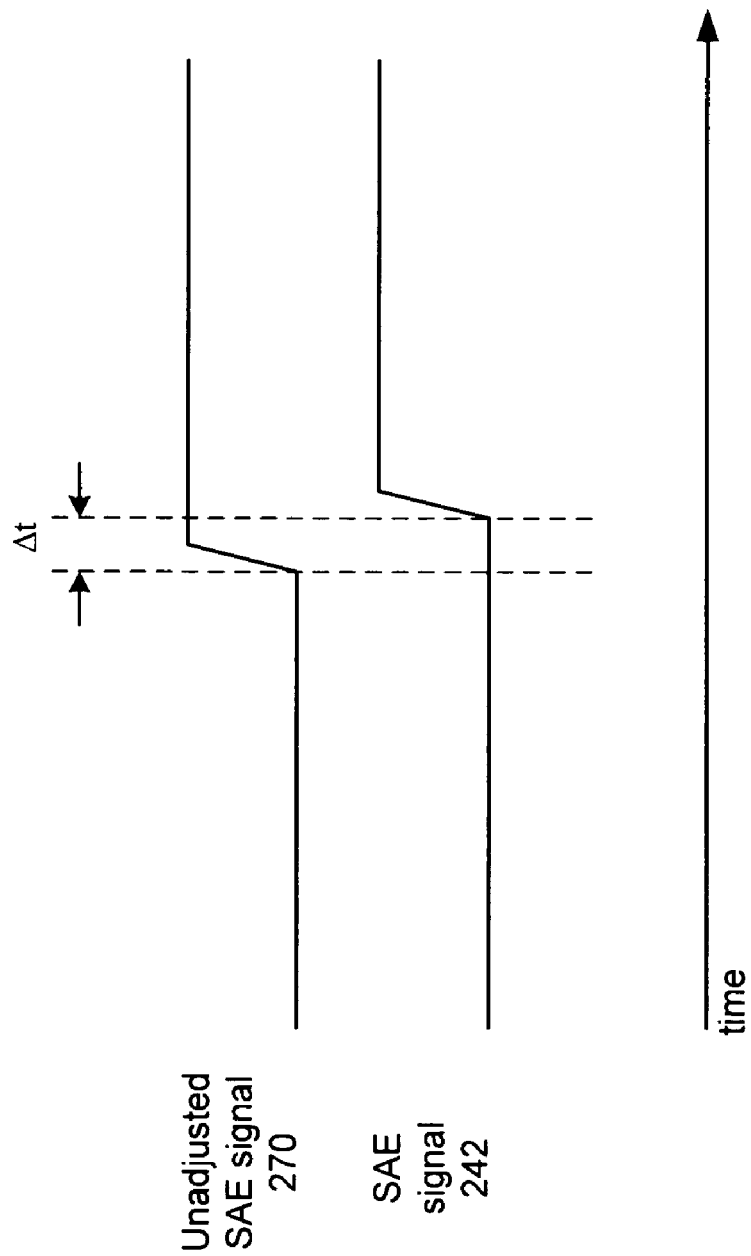

MEMORY, INTEGRATED CIRCUIT AND METHODS FOR ADJUSTING A SENSE AMP ENABLE SIGNAL USED THEREWITH

CROSS REFERENCE TO RELATED PATENTS

Not applicable

BACKGROUND OF THE INVENTION

1. Technical Field of the Invention

The present invention relates to memory circuits such as static random access memories and related methods.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radio, pagers, cellular telephones, computer memory extension (commonly referred to as a thumb drive), etc. Each of these handheld devices includes one or more integrated circuits to provide the functionality of the device. As an example, a handheld FM radio receiver may include multiple integrated circuits to support the reception and processing of broadcast radio signals in order to produce an audio output that is delivered to the user through speakers, headphones or the like. Many such integrated circuits include a processing device that executes a program that includes a sequence of instructions that are stored in a memory device such as a random access memory (RAM). These devices are typically powered from a small battery that has a limited capacity. Reduced power consumption is an important consideration for these devices in order to increase the amount of time the device can operate before the battery needs to be recharged or replaced.

FIG. 1 presents a schematic block diagram representation of a prior art RAM 240. In particular, a static RAM (SRAM) configuration is disclosed that includes an array of individual memory cells such as memory cell 206, that store binary values and that are arranged in a row and column format for ease in binary addressing. A particular memory cell, such as memory cell 206, is accessed by decoding the address 210 with row decoder 200 and column decoder 202. Row decoder 200 selects the particular wordline 212 that corresponds to the row of memory cells that contains memory cell 206. Column decoder 202 selects the particular complementary bitlines 214 and 216, driven by bitline conditioner 204, that correspond to the column of memory cells that contains memory cell 206. Column multiplexer (MUX) 208 couples the selected bitlines 214 and 216 to sense amplifier 224 and data buffer 226. Data are written to individual memory cells from data in line 222 and data buffer 226. Data are read from individual memory cells by sense amplifier 224 and are output on data out line 220.

FIG. 2 presents a block/schematic diagram representation of a prior art bitline conditioner 204 and column multiplexer 208. P-channel metal oxide semiconductor (PMOS) transistors 232 precharge bitlines 214 and 216 in response to a bitline (BL) precharge signal 230. Column MUX 208 includes PMOS transistors 234 that, when turned on by column enable signal 218 during a read operation, pass the signals on the bitline 214 and 216 to sense amplifier inputs 236 and 238. When wordline 212 is activated, the voltage difference between bitlines 214 and 216 is passed to sense amplifier inputs 236 and 238 for conversion to data out 220 by sense amplifier 224. N-channel metal oxide semiconductor (NMOS) transistors 235, during a write operation, passes Vss (or a logic low level) to one of the bitlines 214 and 216 in response to data from data buffer 226.

The use of PMOS transistors 232 and 234 in bitline conditioner 204 and both PMOS transistors 234 and NMOS transistors 235 in column MUX 208 provides for a relatively reliable design, however, this configuration requires greater memory bit cell array peripheral area and consumes more power when compared with the alternative prior art design shown in FIG. 3 that follows.

FIG. 3 presents a block/schematic diagram representation of an alternative prior art bitline conditioner 205 and column multiplexer 209. In particular, NMOS transistors 233 are used to implement bitline conditioner 205 and an NMOS only column MUX 209 is implemented with transistors 235.

One of the common ways to save power of a memory is a block activation or segmented array architecture. This segmented configuration decreases the length of the bitlines and lowers the bitline capacitance, allowing for faster bitline discharge and consequently faster read operations or conversely, lower power consumption. However, the silicon area overhead created by the greater memory peripheral area makes these segmented configurations costly to implement because each memory segment requires it own bitline conditioner and column multiplexer. Because this design uses less peripheral overhead than the prior art circuit described in FIG. 2, the alternative prior art design of FIG. 3 is more suitable for a segmented array memory architecture. In particular, NMOS transistors 233 occupy less area than PMOS transistors 232 and the elimination of inverter 217 and PMOS transistor 234 also saves space in the design that is replicated for each bitline pair.

However, NMOS transistors 233 can generate an unpredictable precharge level due to NMOS transistor leakage, variations in drain voltage, etc. In particular, if the precharge level increases to a voltage level greater than the drain voltage VDD, minus the NMOS threshold voltage VT, the time until the bitline voltages 214 and 216 are transferred to the sense amplifier side of column MUX transistors 235 becomes unpredictable.

In any of these prior art memories, when the bitline differential is not large enough to overcome mismatches and offsets inherent in the sense amplifier, then the output may not produce the correct result during sensing. The incorrect results negatively impact yields at corners where bitline development is inadequate. The need exists for memory devices that consume less power and that can be implemented efficiently in integrated circuit designs.

BRIEF DESCRIPTION OF THE SEVERAL VIEWS OF THE DRAWINGS

FIG. 12 presents a timing diagram in accordance with an embodiment of the present invention;

DETAILED DESCRIPTION OF THE INVENTION INCLUDING THE PRESENTLY PREFERRED EMBODIMENTS

Figure 1:
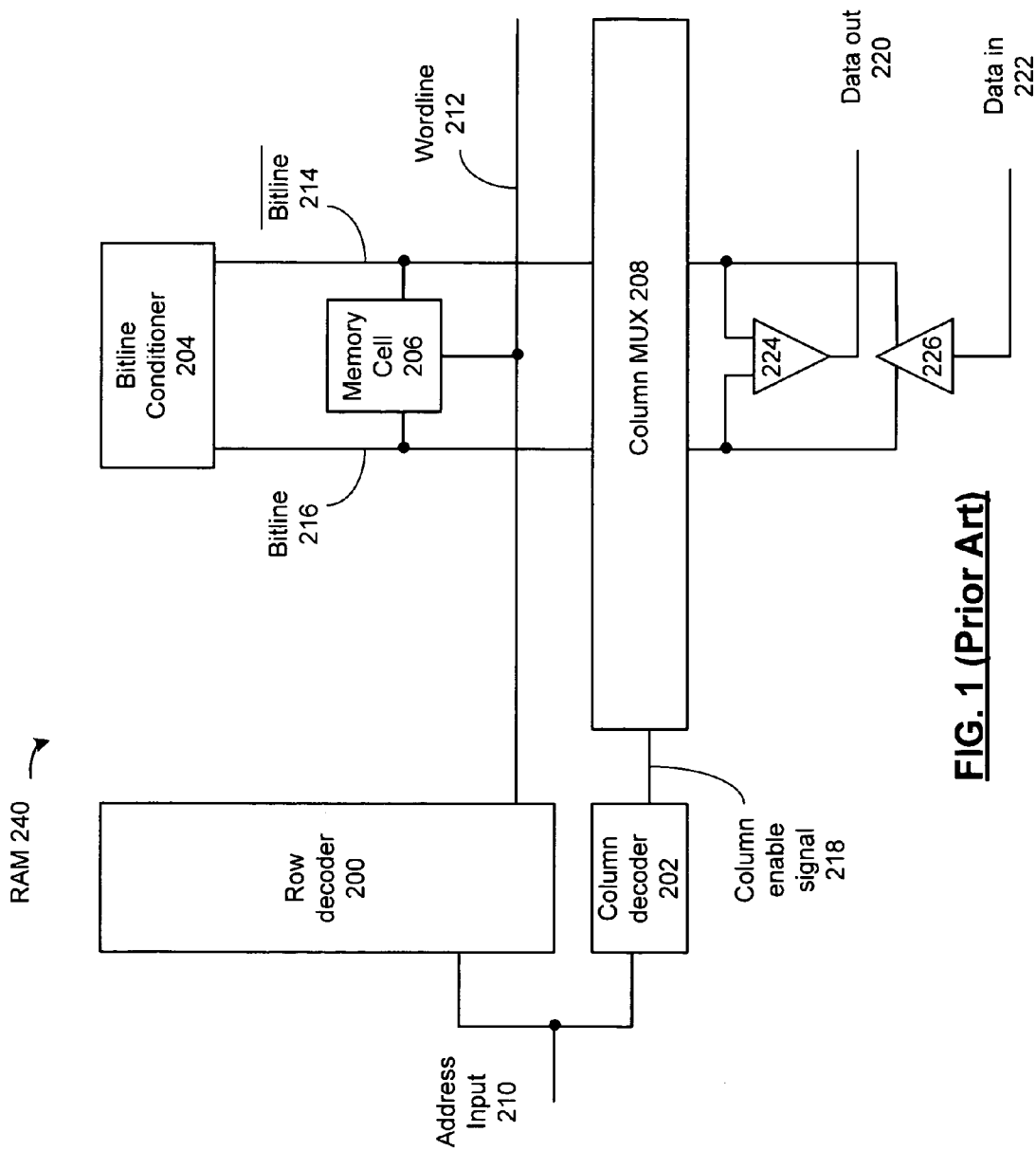
FIG. 1 presents a schematic block diagram representation of a prior art RAM 240.
Figure 2:
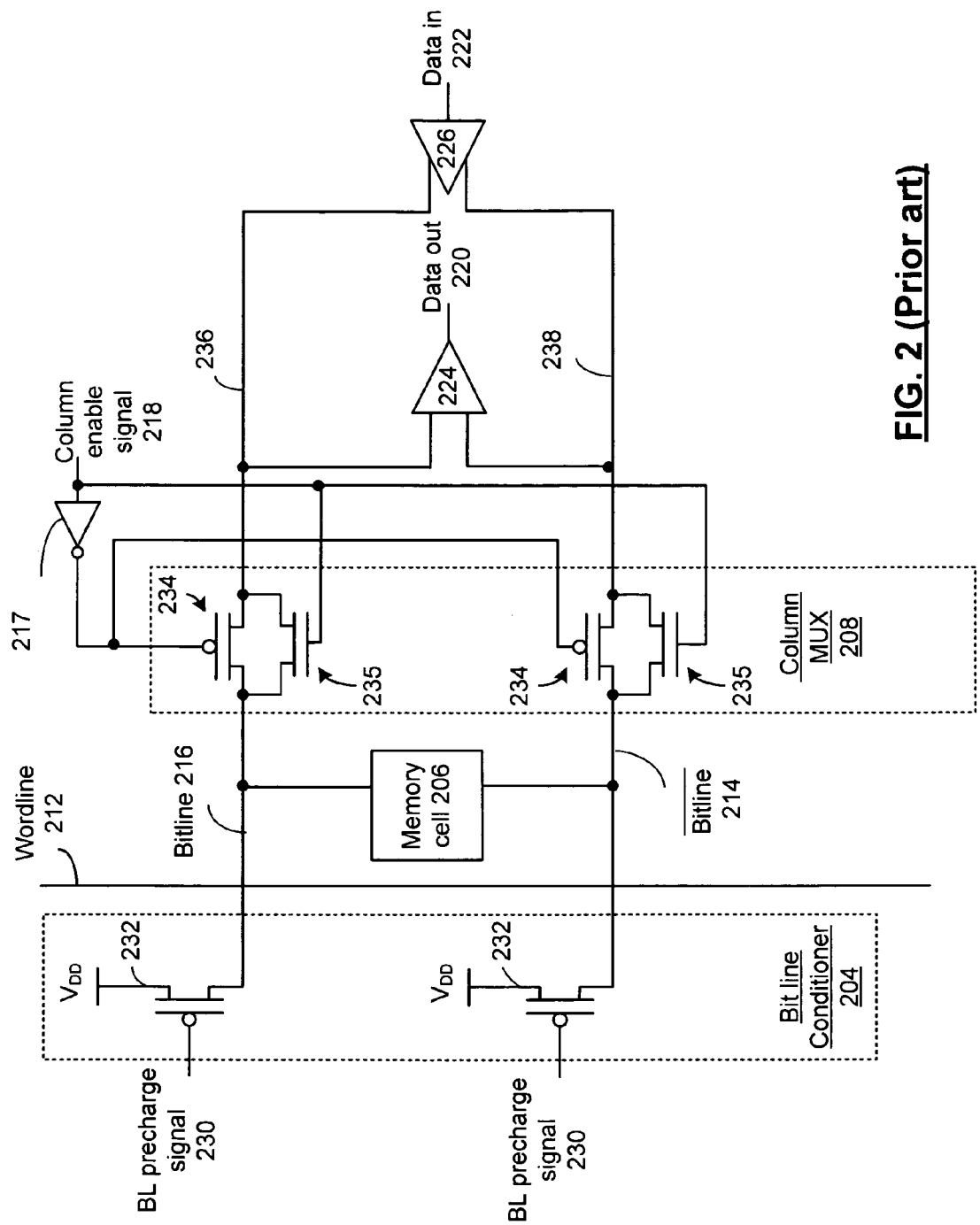
FIG. 2 presents a block/schematic diagram representation of a prior art bitline conditioner 204 and column multiplexer 208.
Figure 3:
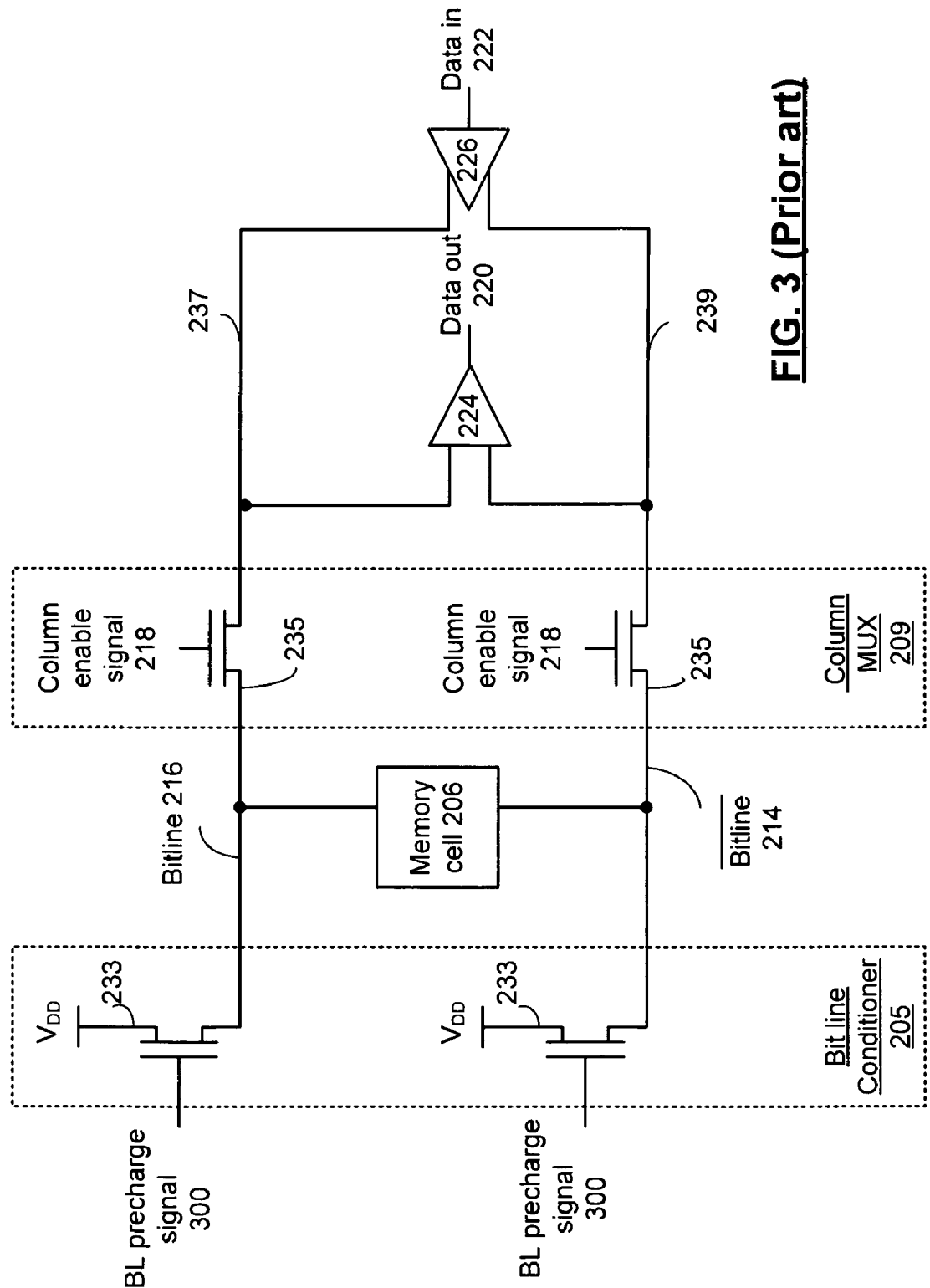
FIG. 3 presents a block/schematic diagram representation of an alternative prior art bitline conditioner 205 and column multiplexer 209.
Figure 4:
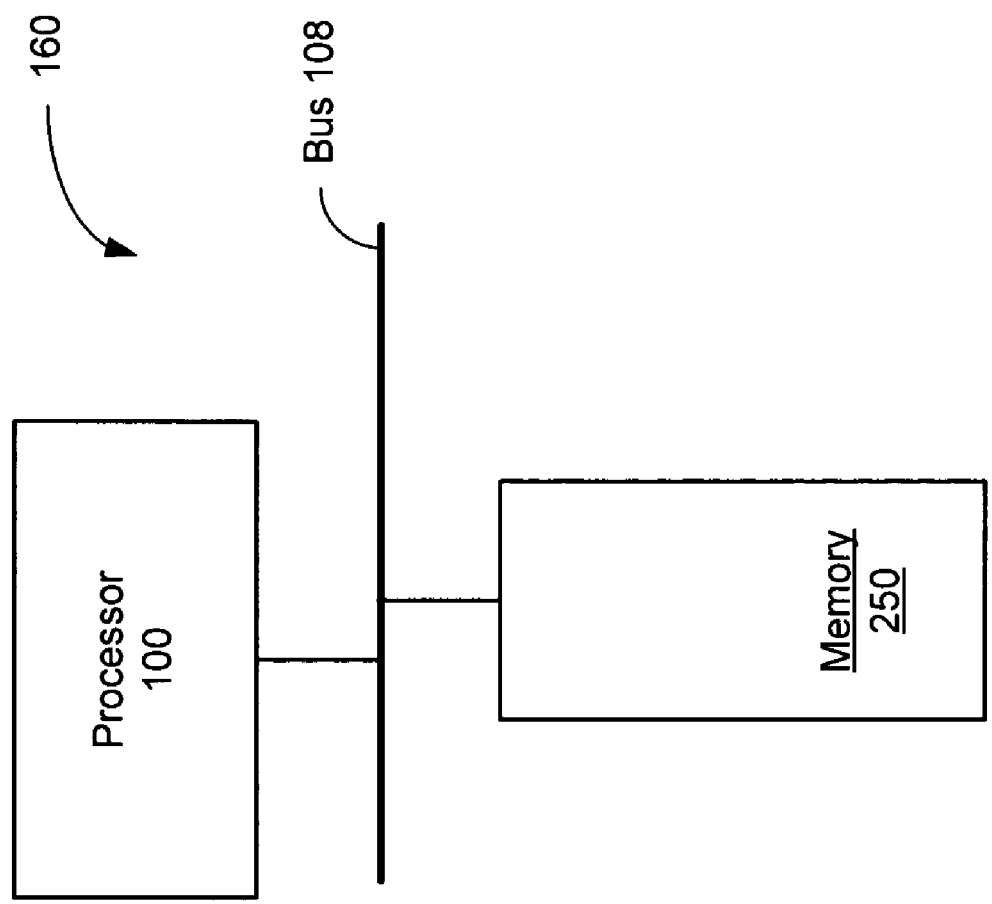
FIG. 4 presents a combination schematic/block diagram representation of a processing system 160 in accordance with an embodiment of the present invention.

FIG. 4 presents a combination schematic/block diagram representation of a processing system 160 in accordance with an embodiment of the present invention. In particular, a processing system 160 is presented that includes a processor 100 and memory device 250 such as a random access memory (RAM), read-only memory (ROM), flash memory or other memory configuration, and via bus 108. In an embodiment of the present invention, processing system 160 is implemented using an integrated circuit on either a stand-alone basis, or as part of a system on a chip (SoC) integrated circuit that optionally includes one or more addition modules, such as for processing an input signal and producing an output signal in response thereto.

Processor 100 can be implemented using a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 250 may be a single memory device or a plurality of memory devices. Such a memory device may be a read-only memory, random access memory, volatile memory, non-volatile memory, static memory, dynamic memory, flash memory, cache memory, and/or any device that stores digital information.

Memory 250 includes novel features as will be described in further detail in conjunction with the figures that follow.

Figure 5:
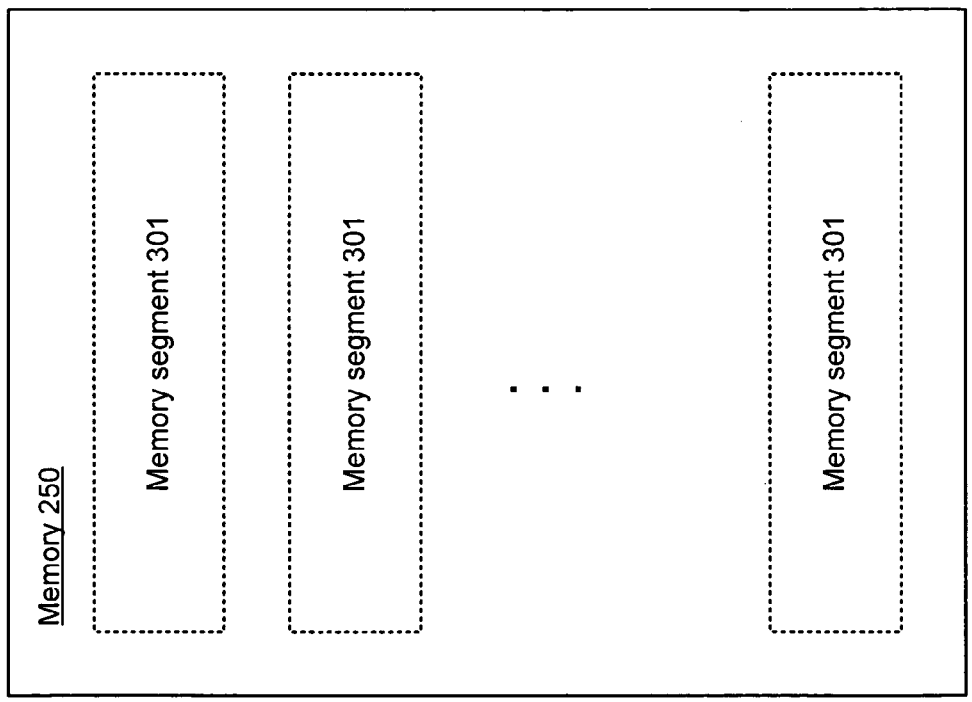
FIG. 5 presents a schematic block diagram representation of a memory 250 in accordance with an embodiment of the present invention.

FIG. 5 presents a schematic block diagram representation of a memory 250 in accordance with an embodiment of the present invention. In particular, a segmented memory architecture is employed that includes a plurality of memory segments 301. The segmentation of the memory array provides decreased bitline length and lower bitline capacitance. The problems associated with potential mismatches and offsets inherent in the sense amplifier and unpredictable settling times can be solved by a sense amp enable generation module capable of adjusting the timing of the sense amplifier enable signal that triggers the capture of output data 220 by the sense amplifier (sense amp) 224. In particular, the sense amp enable signal can be generated with a programmable delay that is adjusted based on results of an actual bitline sense. This way, the memory can self correct by adjusting the amount of bitline differential on the next read cycle. Further details regarding various functions and features of this sense amp enable generation module and possible implementations are presented in conjunction with FIGS. 6-17 that follow.

Figure 6:
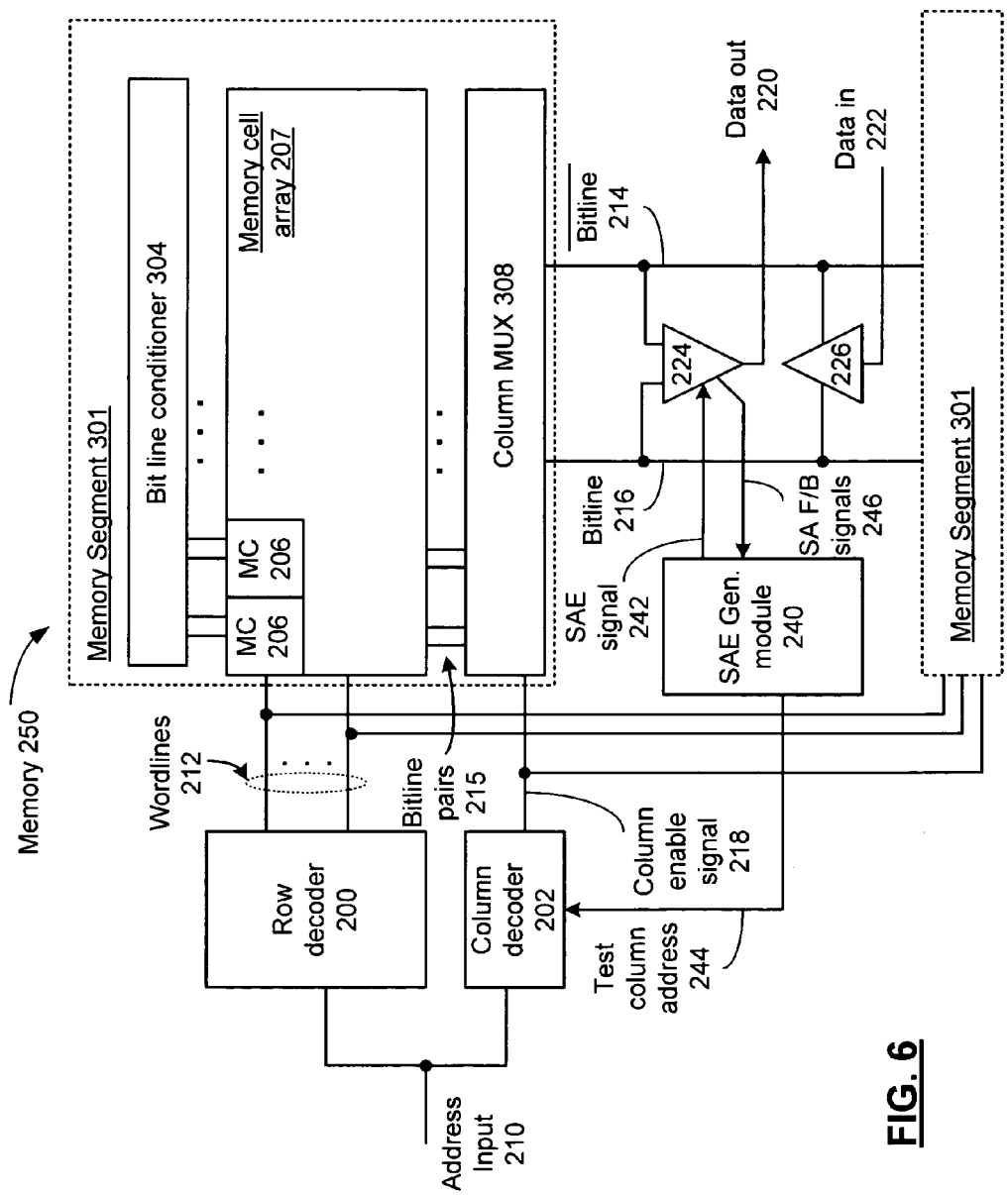
FIG. 6 presents a schematic block diagram representation of a memory 250 in accordance with an embodiment of the present invention.

FIG. 6 presents a schematic block diagram representation of a memory 250 in accordance with an embodiment of the present invention. In an embodiment of the present invention, memory 250 is a static RAM (SRAM) device that includes one or more memory segments 301 that contain a memory cell array 207 of individual memory cells 206 that are arranged in a row and column format for ease in binary addressing. FIG. 6 presents a configuration with two memory segments 301, where one of the memory segments has been expanded to show the bit line conditioner 304, memory cell array 207 and column multiplexer 308 that are contained therein. Memory cells 206 can be implemented using complementary metal oxide semiconductor (CMOS) transistors, n-channel metal oxide semiconductor (NMOS) transistors, or with other transistors or electrical devices within the broad scope of the present invention. A particular memory cell is accessed by decoding the address 210 with row decoder 200 and column decoder 202. Row decoder 200 selects one of the wordlines 212 that corresponds to the row of memory cells that contains the selected memory cell. Column decoder 202 selects one of the complementary bitline pairs 215 corresponding to the column of memory cells that contains the particular memory cell. Column multiplexer (MUX) 308 couples the selected bitline pair 215 to sense amplifier 224 and data buffer 226. Data are written to individual memory cells from data in line 222 and data buffer 226. Data are read from individual memory cells by sense amplifier 224 and are output on data out line 220.

Memory 250 further includes sense amp enable (SAE) generation module 240 that generates the sense amp enable signal 242 with adjustable timing, based on sense amp feedback signals 246. In an embodiment of the present invention, memory segments 301 include one or more test columns that can be dummy columns, added to the array, that closely match the functional memory columns of the array or other columns of the array that are chosen to represent the operation of a broader portion of the array. These test columns are used by SAR generation module 240 to simulate actual bitline development that takes place in the functional columns of the array to determine a delay for the sense amp enable signal 242 that allows adequate time for bitline development and accurate reading of the memory cells in the functional columns of each memory segment 301. The SAE generation module 240 optionally generates a test column address 244 that is used to select a test column for the purpose of evaluating the bitline development in a corresponding test column. While SAE generation module is shown in a static RAM (SRAM) configuration, it may likewise be used in dynamic RAM (DRAM) or other memory configurations within the broad scope of the present invention.

Further details regarding the operation and implementation of SAE generation module 240 including alternatives and optional implementations are presented in conjunction with FIGS. 7-12, 15 and 16.

Figure 7:
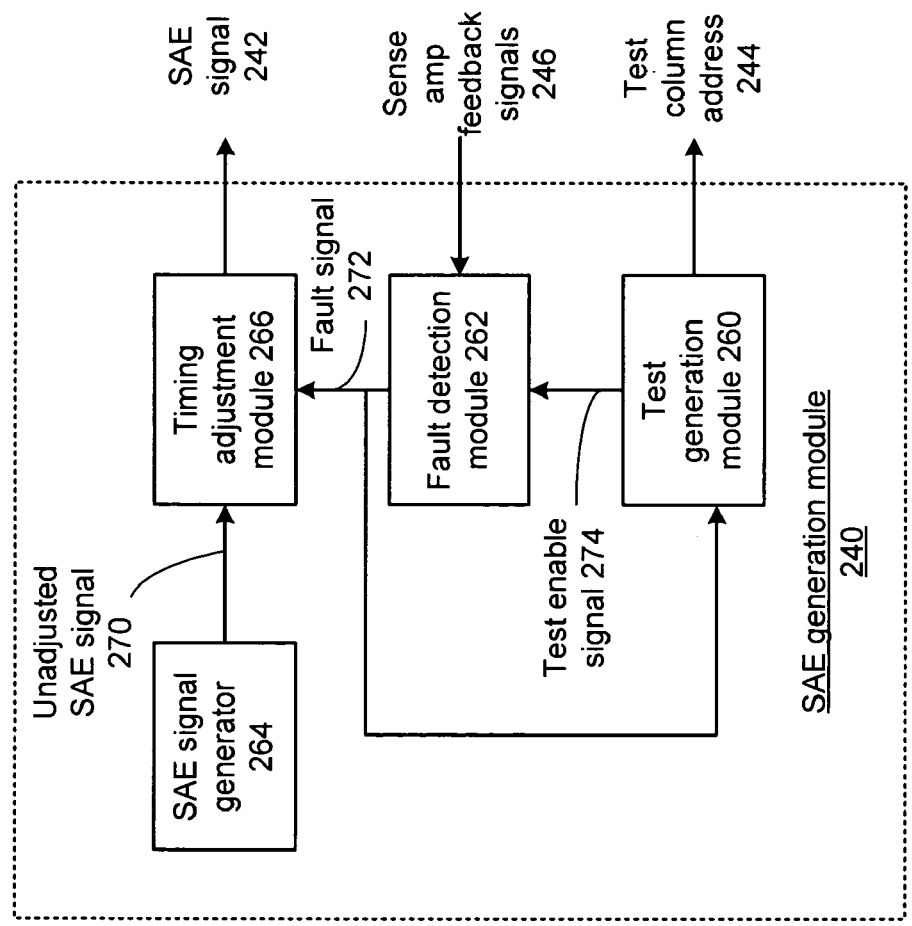
FIG. 7 presents a block diagram representation of a sense amp enable generation module 240 in accordance with an embodiment of the present invention.

FIG. 7 presents a block diagram representation of a sense amp enable generation module 240 in accordance with an embodiment of the present invention. In particular, SAE generation module 240 includes SAE signal generator that produces an unadjusted SAE signal 270, a timing adjustment module 266, that adjusts the timing of the unadjusted SAE signal 270, based on a fault signal 272 generated by fault detection module 262, and a test generation module that generates a test column address 244 corresponding to the test column of one or more of the memory segments and that further generates a test enable signal 274 to initiate a test of the test column.

In an embodiment of the present invention, the SAE signal generator includes a pulse generator that generates a standard sense amp enable signal, trigger by a read clock, column enable signal or other timing signal of memory 250 during a read operation. Timing adjustment signal is initialized to a delay of zero, yielding an initial SAE signal 242 that is simply the unadjusted SAE signal 270. Tests are run on the bitline pair of a test column, by addressing the test column and initiating a read operation of a memory cell within that test column. Test generation module asserts test enable signal 274 that triggers the fault detection module 262 and analyzes the sense amp feedback signals 246 to determine if a fault is detected. In turn, fault detection module 262 asserts fault signal 272 when the fault is detected, that causes timing adjustment module to form SAE signal 242 by adding delay to the unadjusted SAE signal 270. If a fault was detected, test generation module 260 repeats the test to determine if the delay added to the SAE signal 242 is sufficient to eliminate the fault condition, and to iteratively increase the delay and run tests until the fault condition is reliably eliminated. In an embodiment of the present invention, once the fault condition is eliminated, an additional delay is further added by timing adjustment module 266 to provide a margin of reliable operation.

In one mode of operation, the test module generation module 260 operates to adjust the timing of the SAE signal 242 during an initialization of the memory 250 and delays are stored and implemented for the generation of SAE signal 242 in normal operation. In a further mode of operation, test generation module 260 is operable to periodically retest the test column of memory segment 301 to determine if further adjustment is required, based on changes in temperature, operating voltage, component degradation or other changes in operating conditions. Further test generation module can operate to test multiple test columns of a single memory segment, multiple memory cells of a single test column, and/or multiple test columns from multiple memory arrays coupled to sense amplifier 224 to determine a timing adjustment for timing adjustment module 266 that promotes fault-free or substantially fault-free operation of memory 250.

In an embodiment of the present invention test generation module 260 is implemented using processing circuitry that may be implemented using a shared processing device, individual processing devices, or a plurality of processing devices and may further include memory. Such a processing device may be a field programmable gate array, programmable logic device, state machine, logic circuitry, analog circuitry, digital circuitry, and/or any device that manipulates signals (analog and/or digital) based on operational instructions. The memory may storing the corresponding operational instructions is embedded with the circuitry comprising the state machine, analog circuitry, digital circuitry, and/or logic circuitry.

While each of the modules of SAE generation module 240 are shown as being part of memory 250, one or more of these modules may be located separately from and coupled to memory module 250. For instance, fault detection module 262 and test generation module 260 can be provided in a separate device such as separate processing device, shared processing device, etc., that is coupled to sense amp feedback signals 246, column decoder 202, and that couples fault signal 272 to timing adjust module 266. One or more of the signals coupling these separate modules to memory 250 can be multiplexed to reduce the number of pins required to provide an interface between these separate devices.

Figure 8:
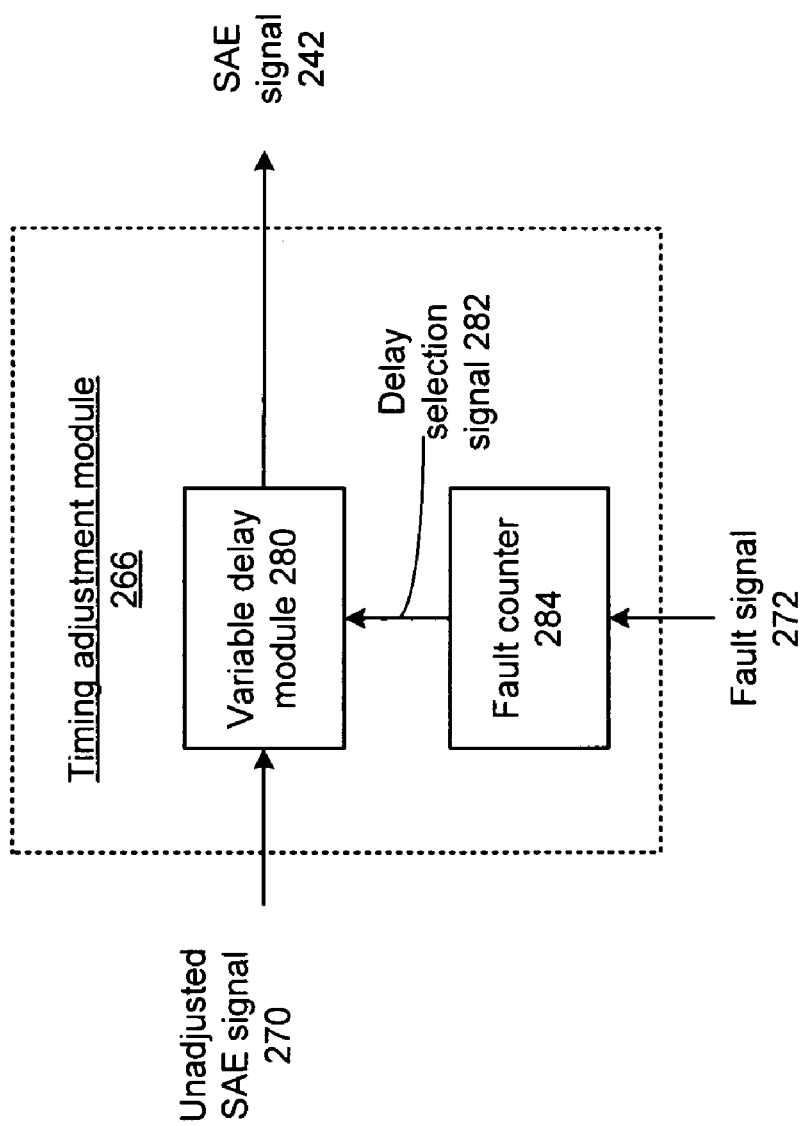
FIG. 8 presents a block diagram representation of a timing adjustment module 266 in accordance with an embodiment of the present invention.

FIG. 8 presents a block diagram representation of a timing adjustment module 266 in accordance with an embodiment of the present invention. In particular, a timing adjustment module 266 is shown that generates the sense amp enable signal 242 based on an unadjusted sense amp enable signal 270. Variable delay module delays the timing of the sense amp enable signal 242 when a fault signal 272 is asserted, in response to the delay selection signal 282 generated by fault counter 284. In this fashion, variable delay module 280 can generate one of N different delays selected in response to the delay selection signal 282, and in particular, selects the smallest delay that results in reliable operation or other acceptable operation of memory segment 301.

Figure 9:
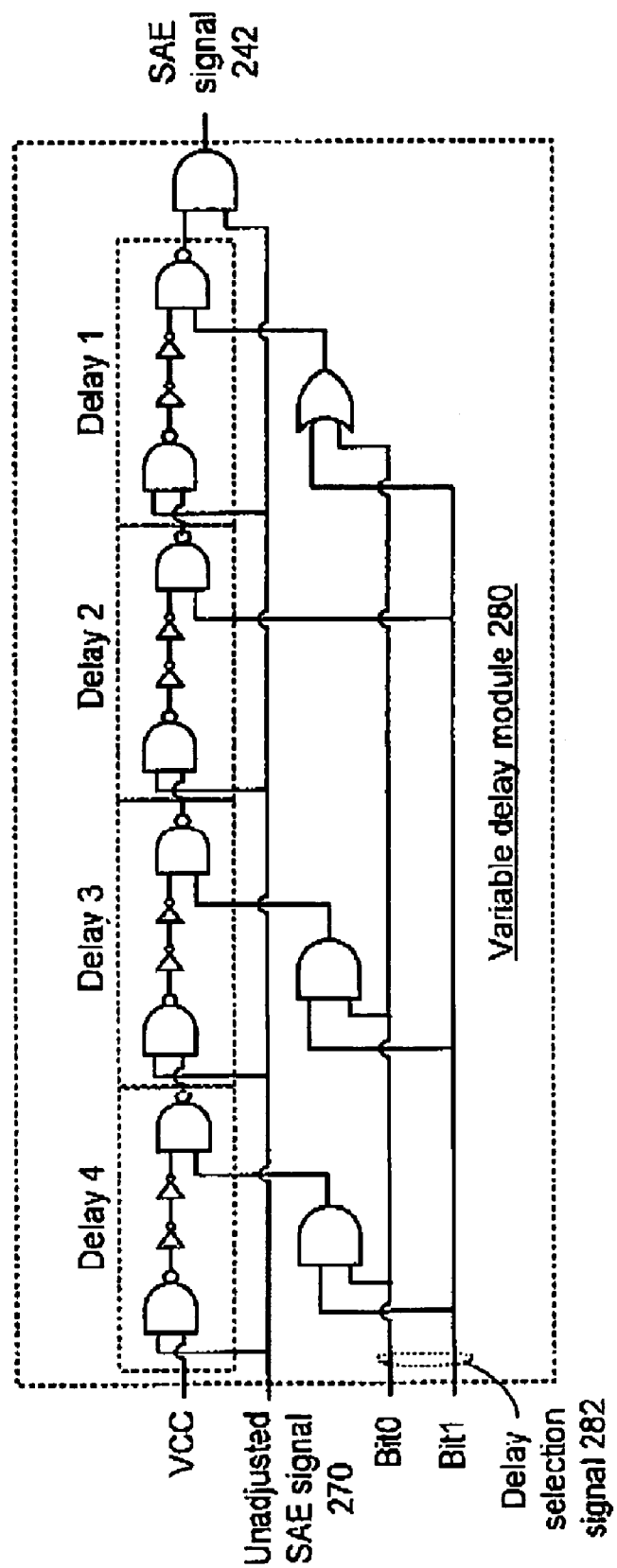
FIG. 9 presents a schematic diagram representation of a variable delay module 280 in accordance with an embodiment of the present invention.

FIG. 9 presents a schematic diagram representation of a variable delay module 280 in accordance with an embodiment of the present invention. In particular, this circuit includes four delay elements (indicated by Delay 1, Delay 2, Delay 3, and Delay 4) and adds delay to the unadjusted SAE signal 270 based on the value of the program bits Bit0 and Bit1 of the delay selection signal 282. Table 1 below shows the total delay based on the value of the program bits.

TABLE 1

Programmable Delay Settings vs. Delay

| Bit1 | Bit0 | Delay (Δt) |
|---|---|---|
| 0 | 0 | None (Default setting/Fastest Access Time) |
| 0 | 1 | Delay 1 |
| 1 | 0 | Delay 1 + Delay 2 |
| 1 | 1 | Delay 1 + Delay 2 + Delay 3 + Delay 4 |

The delay configurations can easily be modified, and additional delay can be added to this circuit as required. While the delays introduced by the four delay elements are designed to be substantially constant (subject to individual device variations) the delay elements can implement different delay times as well. Also, a greater or fewer number of delay elements can likewise be implemented, and selected with a corresponding number of controls bits. Further, variable delay module 280 can be implemented using tapped delay lines, bucket-brigade devices, counters, shift registers, software loops and/or other variable delay elements within the broad scope of the present invention.

Figure 10:
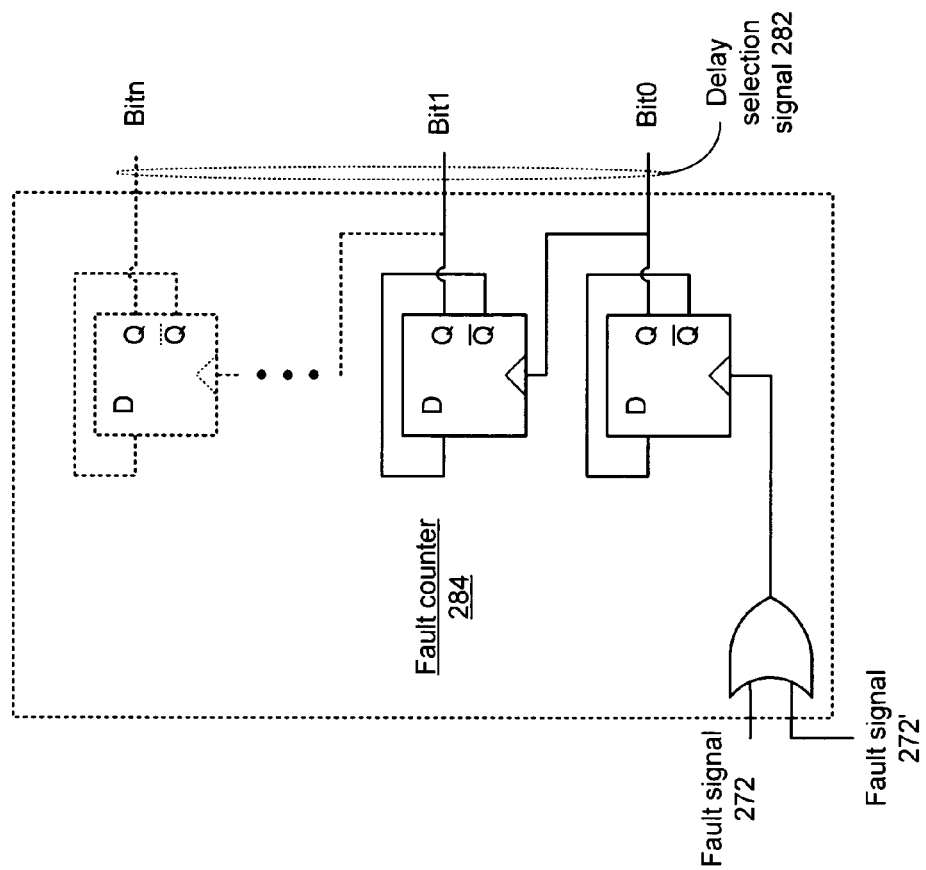
FIG. 10 presents a schematic diagram representation of a fault counter 284 in accordance with an embodiment of the present invention.

FIG. 10 presents a schematic diagram representation of a fault counter 284 in accordance with an embodiment of the present invention. In particular, fault counter 284 includes two or more D flip-flops to increment a fault count when the fault signal is asserted and to generate delay selection signal 282 that increases the delay of the sense amp enable signal in response to the incremented fault count. In this circuit, the two-bit delay selection signal discussed in conjunction with FIG. 9 is generated, however n-bits can be generated if required by the configuration of variable delay module 280 based the addition of further flip-flops to increase the length of the counter. As noted in conjunction with FIG. 9, many implementations of fault counter 284, including shift registers, software counters and other circuitry are likewise possible within the broad scope of the present invention.

In operation, the default setting for delay selection signal 282 is 00. When a fault signal (either fault signal 272 or 272') is asserted, the delay selection signal 282 will be updated from 00 to 01. If this is still not enough delay, the test column will generate a fault again, which will update the counter from 01 to 10 adding more delay to the SAE signal 242. This process continues until data can be read from the test column, and the memory circuit becomes fully functional.

The fault counter circuit shown is triggered by the assertion of either fault signal 272 from a first memory segment 301 or fault signal 272' from another memory segment 301 of memory 250. As previously discussed, the sense amp enable generation module 240 can includes a fault detection module 240 corresponding to each of a plurality the memory segments 301 of memory 250, that determines when a fault is detected by analyzing the sense amp feedback signals 246 corresponding to one of the plurality of memory segments and asserting a fault signal (such as fault signal 272 or 272', etc.) when a fault is detected during testing. In this mode of operation, sense amp enable generation module 240 delays the timing of the sense amp enable signal 242 when a fault signal 272 is asserted for any of the plurality of memory segments 301.

Figure 11:
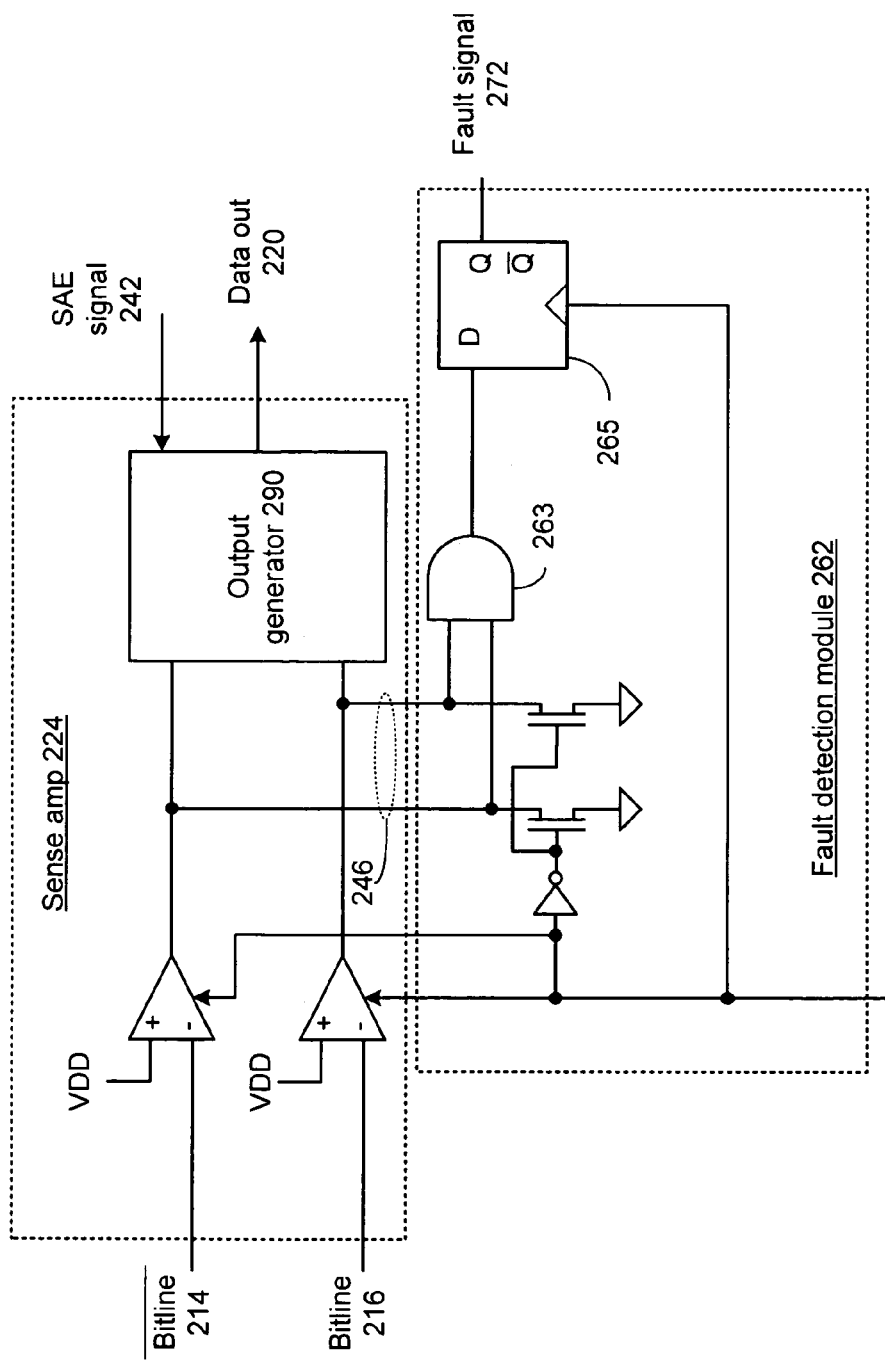
FIG. 11 presents a schematic block diagram representation of a sense amp 224, fault detection module 262 and sense amp feedback signals 246 in accordance with an embodiment of the present invention.

FIG. 11 presents a schematic block diagram representation of a sense amp 224, fault detection module 262 and sense amp feedback signals 246 in accordance with an embodiment of the present invention. In particular, sense amp signals 246 are analyzed by fault detection module 262 to detect whether the bitline development is incomplete, based on the current timing of the SAE signal 242. The sense amp 224 compares the bitline voltage on each of the bitlines 214 and 216 to a constant VDD value. When functioning properly, one or the other of the bitlines will fall, causing the corresponding comparator output to drop to a logic 0 state, while the other comparator output remains at a logic 1 state. Output generator 290, triggered by SAE signal 242, samples these comparator values to generate a logic 1 or logic 0, depending on wither the comparator output is 01 or 10.

The bitline development is sampled using the same functional sense amp 224 used in the active memory array, and on the same SAE signal 242 that is used to determine the data out 220 based on the amount of small signal development in each memory column. If there is not sufficient development, then the comparator output will not fire low in either case. One of either bitline 214 or 216 will remain high because it is not being pulled low by the NMOS pull down in the memory cell. The other bitline will be pulled low by the NMOS pull down, and if it is not pulled low sufficiently, the corresponding comparator output will remain high.

Fault detection module 262 analyzes the sense amp feedback signals 246 and asserts the fault signal 272 when the differential voltage from the corresponding bitline pair of the test columns compares unfavorably to a threshold. If both comparator outputs (sense amp feedback signals 246) remain high, then a fault is detected by fault detection circuit 262. In particular, the inputs to AND gate 263 are enabled with rise of SAE signal 242, and if both are high, are, latched by D flip-flop 265. Note that SAE signal 242 is used to latch the fault signal 272 on the falling/trailing edge because the signal will eventually resolve, but if it doesn't resolve by the time SAE signal 242 falls, then a functional error will occur.

FIG. 12 presents a timing diagram in accordance with an embodiment of the present invention. In particular, this timing diagram illustrates the rising edge of SAE signal 242 being delayed by the adjustable amount, Δt, based on the functions and features of SAE generation module 240 that have been previously discussed.

Figure 14:
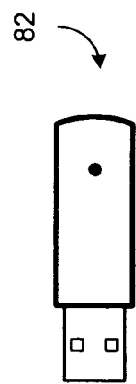
FIGS. 13-15 present pictorial diagrams of various devices in accordance with an embodiment of the present invention.
Figure 15:
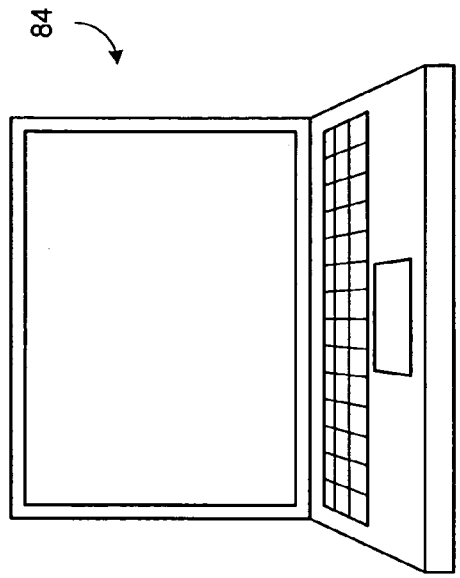
Figure 13:
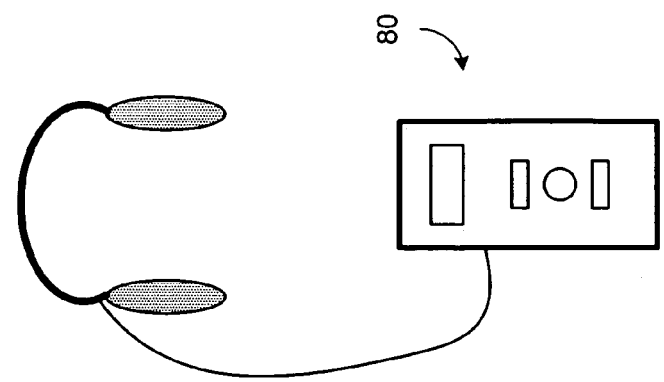

FIGS. 13-15 present pictorial diagrams of various devices in accordance with an embodiment of the present invention. While the preceding disclosure has been directed to a memory 250 used in conjunction with a processing system 160, in an embodiment of the present invention, memory 250 may be implemented by itself in an integrated circuit such as a memory chip. While implemented as a memory chip, as part of a processing system 160 or as part of a system on a chip integrated circuit, memory 250 can be used in a wide variety of electronic devices such as handheld audio/video player 80, universal service bus (USB) device 82, in computer 84, or in a variety of other electronic devices that employ memory devices.

Figure 16:
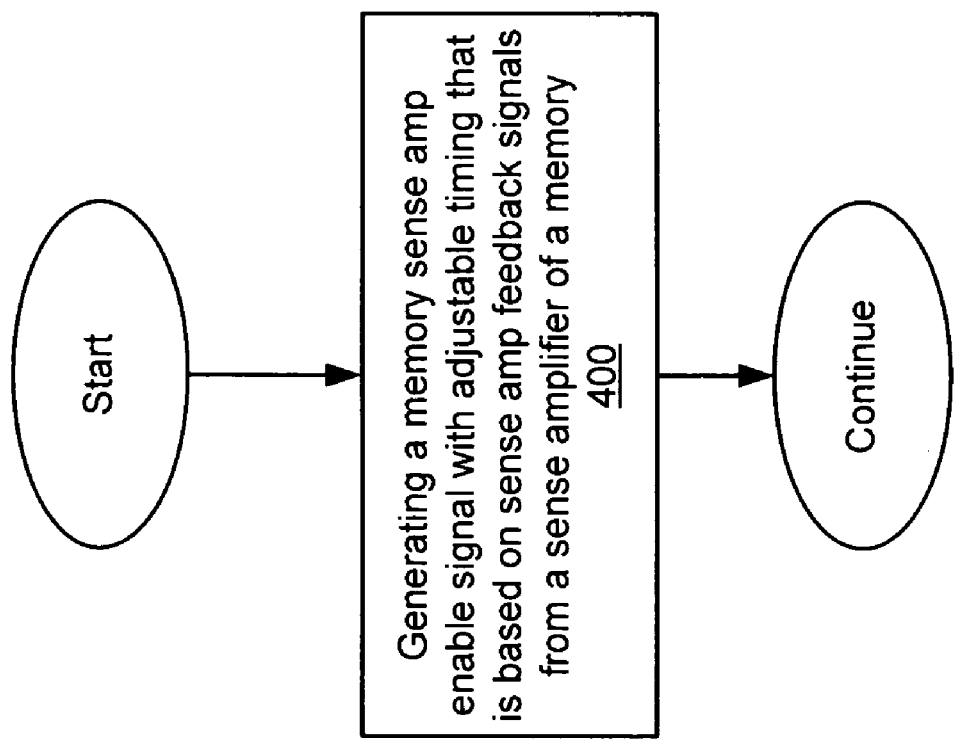
FIG. 16 presents a flowchart representation of a method in accordance with an embodiment of the present invention.

FIG. 16 presents a flowchart representation of a method in accordance with an embodiment of the present invention. In particular, a method is presented for use in conjunction with one or more features or functions presented in conjunction with FIGS. 4-15. In step 400, a sense amp enable signal is generated with adjustable timing that is based on sense amp feedback signals from a sense amplifier of a memory.

Figure 17:
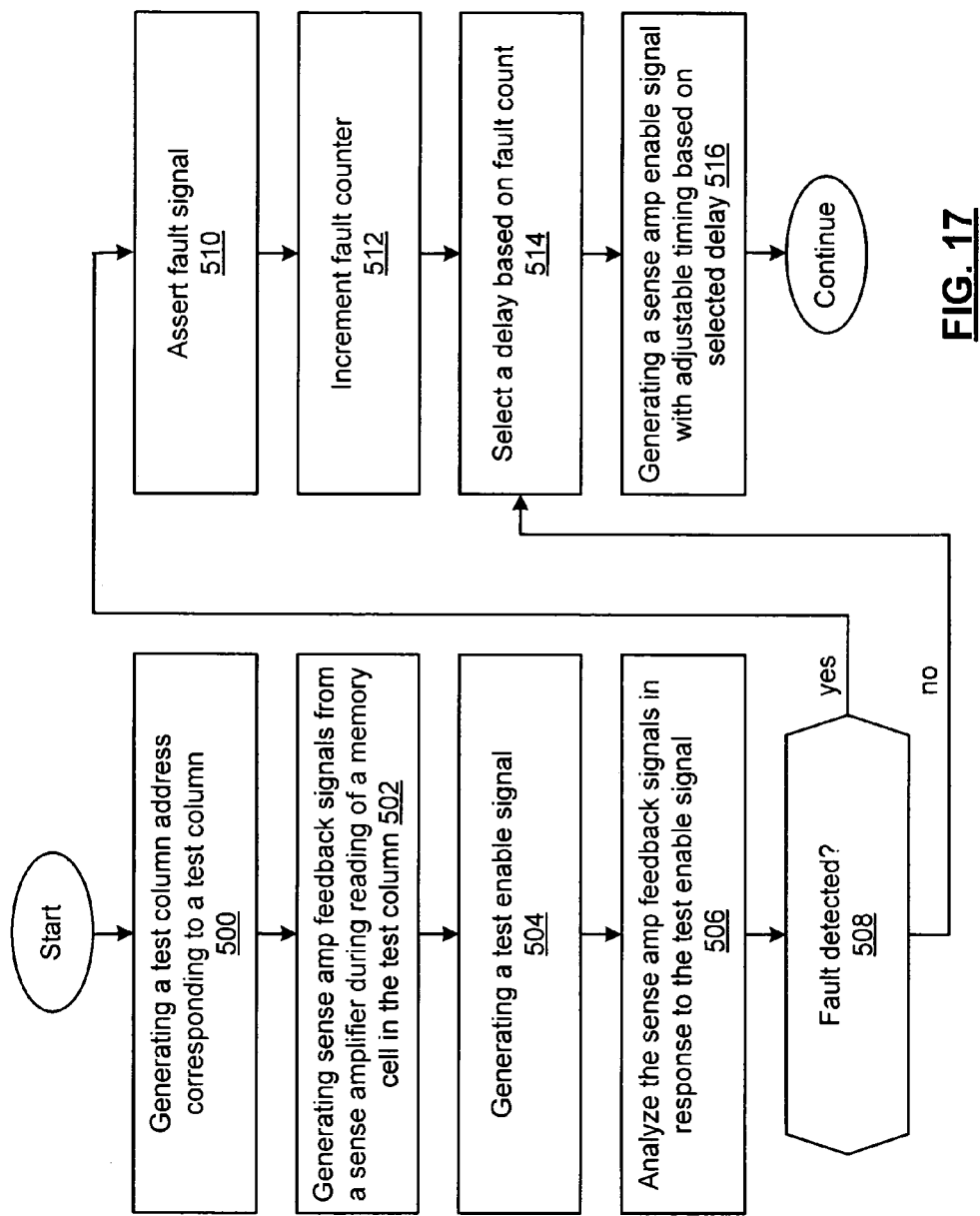
FIG. 17 presents a flowchart representation of a method in accordance with an embodiment of the present invention.

FIG. 17 presents a flowchart representation of a method in accordance with an embodiment of the present invention. In particular, a method is presented for use in conjunction with one or more features or functions presented in conjunction with FIGS. 4-16. In step 500, a test column address is generated corresponding to the test column. In step 502, sense amp feedback signals are generated from the sense amplifier during reading of a memory cell in the test column. In step 504, a test enable signal is generated. In step 506, the sense amp feedback signals are analyzed in response to the test enable signal. In step 508, the method determines if a fault is detected. If so, the method proceeds to step 510 where a fault signal is asserted and step 512 where a fault counter is incremented. Otherwise, the method proceeds directly to step 514 where a delay is selected based on the fault count. In step 516, a sense amp enable signal is generated with adjustable timing based on the selected delay.

In an embodiment of the present invention, step 508 includes analyzing the sense amp feedback signals and asserting the fault signal when a differential voltage from a corresponding bitline pair of a test column compares unfavorably to a threshold. Further, step 508 can include analyzing the sense amp feedback signals at the trailing edge of the sense amp enable signal. Step 508 can further include determining when a fault is detected by analyzing the sense amp feedback signals corresponding to a plurality of memory segments and asserting the fault signal when the fault is detected in at least one of the plurality of memory segments.

In an embodiment, step 516 delays the sense amp enable signal when a fault signal is asserted. In particular, step 514 increases the selected delay of the sense amp enable signal in response to an incremented fault count.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The various circuit components can be implemented using 0.08 to 0.35 micron CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a memory, a processing system, integrated circuit and an SAE generation module. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A memory comprising:
   at least one memory segment that includes an array of memory cells arranged in a plurality of columns, each of the plurality of columns having a corresponding bitline pair, wherein the at least one memory segment includes a test column;
   an address decoder, coupled to the at least one memory segment, the address decoder including a row decoder and a column decoder that addresses a selected one of the array of memory cells in a selected one of the plurality of columns in response to a memory address;
   a sense amplifier, coupled to the at least one memory segment, the sense amplifier, in response to a sense amp enable signal, that generates a data output by sensing a differential voltage from the corresponding bitline pair of the selected one of the plurality of columns; and
   a sense amp enable signal generator, coupled to the sense amplifier, that generates the sense amp enable signal with adjustable timing, based on sense amp feedback signals, wherein the sense amp enable signal generator is coupled to the address decoder, and wherein the sense amp enable signal generator includes a test generation module that generates a test column address corresponding to the test column.

2. The memory of claim 1 wherein the sense amp enable generation module further includes a fault detection module, and wherein the test generation module further generates a test enable signal that, when asserted, triggers the fault detection module to determine when a fault is detected by analyzing the sense amp feedback signals and to assert a fault signal when the fault is detected.

3. The memory of claim 2 wherein the fault detection module analyzes the sense amp feedback signals and asserts the fault signal when the differential voltage from the corresponding bitline pair of the selected one of the plurality of columns compares unfavorably to a threshold.

4. The memory of claim 3 wherein the fault detection module analyzes the sense amp feedback signals at the trailing edge of the sense amp enable signal.

5. The memory of claim 1 wherein the sense amp enable generation module includes a timing adjustment module that generates the sense amp enable signal based on an unadjusted sense amp enable signal.

6. The memory of claim 5 wherein the timing adjustment module includes a variable delay module that delays the timing of the sense amp enable signal when a fault signal is asserted.

7. The memory of claim 6 wherein the timing adjustment module includes a fault counter, coupled to the variable delay module, that increments a fault count when the fault signal is asserted and generates a delay selection signal that increases the delay of the sense amp enable signal in response to the incremented fault count.

8. The memory of claim 1 wherein the at least one memory segment includes a plurality of memory segments, wherein the sense amp enable generation module includes a fault detection module corresponding to each of the memory segments, that determines when a fault is detected by analyzing the sense amp feedback signals corresponding to one of the plurality of memory segments and asserting a fault signal when the fault is detected.

9. The memory of claim 8 wherein the sense amp enable generation module delays the timing of the sense amp enable signal when a fault signal is asserted for any of the plurality of memory segments.

10. An integrated circuit comprising:
    a processing module;
    a memory, coupled to the processing module, that stores data in an array of memory cells for use by the processing module, the memory comprising:
    at least one memory segment that includes the array of memory cells arranged in a plurality of columns, each of the plurality of columns having a corresponding bitline pair;
    an address decoder, coupled to the at least one memory segment, the address decoder including a row decoder and a column decoder that addresses a selected one of the array of memory cells in a selected one of the plurality of columns in response to a memory address;
    a sense amplifier, coupled to the at least one memory segment, the sense amplifier, in response to a sense amp enable signal, that generates a data output by sensing a differential voltage from the corresponding bitline pair of the selected one of the plurality of columns; and a sense amp enable signal generator, coupled to the sense amplifier, that generates the sense amp enable signal with adjustable timing, based on sense amp feedback signals, wherein the sense amp enable generation module includes a timing adjustment module that generates the sense amp enable signal based on an unadjusted sense amp enable signal.

11. The memory of claim 10 wherein the at least one memory segment includes a test column, wherein the sense amp enable signal generator is coupled to the address decoder, and wherein the sense amp enable signal generator includes a test generation module that generates a test column address corresponding to the test column.

12. The memory of claim 11 wherein the sense amp enable generation module further includes a fault detection module, and wherein the test generation module further generates a test enable signal that, when asserted, triggers the fault detection module to determine when a fault is detected by analyzing the sense amp feedback signals and to assert a fault signal when the fault is detected.

13. The memory of claim 12 wherein the fault detection module analyzes the sense amp feedback signals and asserts the fault signal when the differential voltage from the corresponding bitline pair of the selected one of the plurality of columns compares unfavorably to a threshold.

14. The memory of claim 13 wherein the fault detection module analyzes the sense amp feedback signals at the trailing edge of the sense amp enable signal.

15. The memory of claim 10 wherein the timing adjustment module includes a variable delay module that delays the timing of the sense amp enable signal when a fault signal is asserted.

16. The memory of claim 15 wherein the timing adjustment module includes a fault counter, coupled to the variable delay module, that increments a fault count when the fault signal is asserted and generates a delay selection signal that increases the delay of the sense amp enable signal in response to the incremented fault count.

17. The memory of claim 10 wherein the at least one memory segment includes a plurality of memory segments, wherein the sense amp enable generation module includes a fault detection module corresponding to each of the memory segments, that determines when a fault is detected by analyzing the sense amp feedback signals corresponding to one of the plurality of memory segments and asserting a fault signal when the fault is detected.

18. The memory of claim 17 wherein the sense amp enable generation module delays the timing of the sense amp enable signal when a fault signal is asserted for any of the plurality of memory segments.

19. A method comprising:

generating a sense amp enable signal with adjustable timing that is based on sense amp feedback signals from a sense amplifier of a memory, by delaying the sense amp enable signal when a fault signal is asserted.

20. The method of claim 19 further comprising:

generates a test column address corresponding to the test column; and generating the sense amp feedback signals from the sense amplifier during reading of a memory cell in the test column.

21. The method of claim 19 further comprising:

generating a test enable signal;

determining when a fault is detected, in response to the test enable signal, by analyzing the sense amp feedback signals; and asserting a fault signal when the fault is detected.

22. The method of claim 21 wherein the step of determining when a fault is detected includes analyzing the sense amp feedback signals and asserting the fault signal when a differential voltage from a corresponding bitline pair of a test column compares unfavorably to a threshold.

23. The method of claim 22 wherein the step of determining when a fault is detected includes analyzing the sense amp feedback signals at the trailing edge of the sense amp enable signal.

24. The method of claim 19 further comprising:

incrementing a fault count when the fault signal is asserted;

wherein the step of generating a memory sense amp enable signal increases the delay of the sense amp enable signal in response to the incremented fault count.

25. The method of claim 19 further comprising:

determining when a fault is detected by analyzing the sense amp feedback signals corresponding to a plurality of memory segments and asserting the fault signal when the fault is detected in at least one of the plurality of memory segments.

* * * * *